(12) United States Patent
Moriya et al.

(10) Patent No.: US 7,054,707 B2
(45) Date of Patent: May 30, 2006

(54) ELECTRONIC COMPONENT MOUNTING SYSTEM AND ELECTRONIC COMPONENT MOUNTING METHOD

(75) Inventors: Yuji Moriya, Tatebayashi (JP); Tomise Koyama, Ota (JP); Hiroshi Nakamura, Kasai (JP); Manabu Okamoto, Isesaki (JP); Kenichi Hayashi, Gunma (JP); Toshio Azuma, Kumagaya (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 0 days.

(21) Appl. No.: 11/011,766

(22) Filed: Dec. 15, 2004

(65) Prior Publication Data
US 2005/0165505 A1 Jul. 28, 2005

(30) Foreign Application Priority Data
Dec. 19, 2003 (JP) ............................. 2003-422595

(51) Int. Cl.
*G06F 19/00* (2006.01)
(52) U.S. Cl. .................. 700/121; 700/213; 700/95; 250/559.29; 29/741
(58) Field of Classification Search ................ 700/95, 700/213, 108, 109, 121, 116; 29/740, 741, 29/760; 250/559.29; 198/817, 369.1, 586
See application file for complete search history.

(56) References Cited

U.S. PATENT DOCUMENTS

2003/0027363 A1* 2/2003 Kodama ...................... 438/14
2004/0080897 A1* 4/2004 Kodama et al. ............. 361/234
2004/0130863 A1* 7/2004 Shimizu et al. ............. 361/683
2005/0036274 A1* 2/2005 Suhara et al. ............... 361/600
2005/0077340 A1* 4/2005 Nagafuku et al. ............. 228/8

FOREIGN PATENT DOCUMENTS
JP 07-094896 4/1995

* cited by examiner

*Primary Examiner*—Kidest Bahta
(74) *Attorney, Agent, or Firm*—Morrison & Foerster LLP

(57) ABSTRACT

This invention is directed to prevention of setting a component feeding unit set with other storage member than a storage member storing same type of components as components in shortage in an electronic component mounting apparatus. A component mounting apparatus sends notice information about component shortage to a control computer when a number of electronic components in a storage member reduces and reaches a level for sending the notice information of component shortage during mounting operations. The control computer stores the notice information, and sends the notice information to a monitor computer to display this information on a monitor. A new storage member having the corresponding components is set in the component feeding unit based on the displayed notice information, and an operator inputs information A about which component feeding unit is set with the storage member and which components are stored in the storage member set in the component feeding unit. The monitor computer sends the information A and information about completion of registration of a relation between the component feeding unit and the components to the control computer, and the control computer stores this information in a memory and sends the information about registration to the monitor computer, and the monitor displays the notice information in a different color.

4 Claims, 6 Drawing Sheets

FIG.6

| date and time | apparatus | lane | component ID | feeder SN |
|---|---|---|---|---|
| 2003/12/03 10:40:06 | MC-1 | 101 | COMP-ID | FD08001 |
| | | | | |

ELECTRONIC COMPONENT MOUNTING SYSTEM AND ELECTRONIC COMPONENT MOUNTING METHOD

CROSS-REFERENCE OF THE INVENTION

This invention is based on Japanese Patent Application No. 2003-422595, the content of which is incorporated by reference in its entirety.

BACKGROUND OF THE INVENTION

1. Field of the Invention

This invention relates to an electronic component mounting system having a plurality of component feeding units feeding electronic components stored in storage members and an electronic component mounting apparatus for picking the electronic components up from the component feeding units and mounting the electronic components on a printed board, and an electronic component mounting method of picking the electronic components up from the plurality of the component feeding units feeding the electronic components stored in the storage members and mounting the electronic components on the printed board by the electronic component mounting apparatus.

2. Description of the Related Art

This type of electronic component mounting system has a memory for storing information about a number of remaining components or component shortage in the electronic component mounting apparatus, and a component shortage display device that is provided near a stockroom and displays the information about the number of remaining components and the component shortage stored in the memory. The relating technology is disclosed in the Japanese Patent Application Publication No. hei 7-94896.

However, when at a shortage of the electric components a storage member storing the same type of electronic components as the components in shortage is set by an operator in the component feeding unit and then set in the electronic component mounting apparatus, sometimes the operator mistakenly sets a component feeding unit that does not correspond to the components in shortage in the electronic component mounting apparatus.

SUMMARY OF THE INVENTION

The invention provides an electronic component mounting system that includes an electronic component mounting apparatus having a plurality of component feeding units feeding electronic components from a storage member, a memory provided in each of the component feeding units and keeping track of the number of electronic components remaining in the storage member to generate a notice of shortage of electronic components, the number decreasing as the electronic components are mounted on printed boards, and a CPU outputting the notice when the number of the electronic components remaining the storage reaches a predetermined number, and a monitor computer including a display device displaying the notice and an input device inputting replenishment data related to electric components supplied in response to the notice and a component feeding unit receiving the supplied electric components. The monitor computer changes a display status of the notice displayed on the display device based on a confirmation of a completion of a registration of component registration event data comprising the replenishment data.

BRIEF DESCRIPTION OF THE DRAWINGS

FIG. 6 shows a monitor screen used in the line of FIG. 1.

DESCRIPTION OF THE PREFERRED EMBODIMENT

An embodiment of the invention will be described with reference to drawings hereafter.

Figure 1:
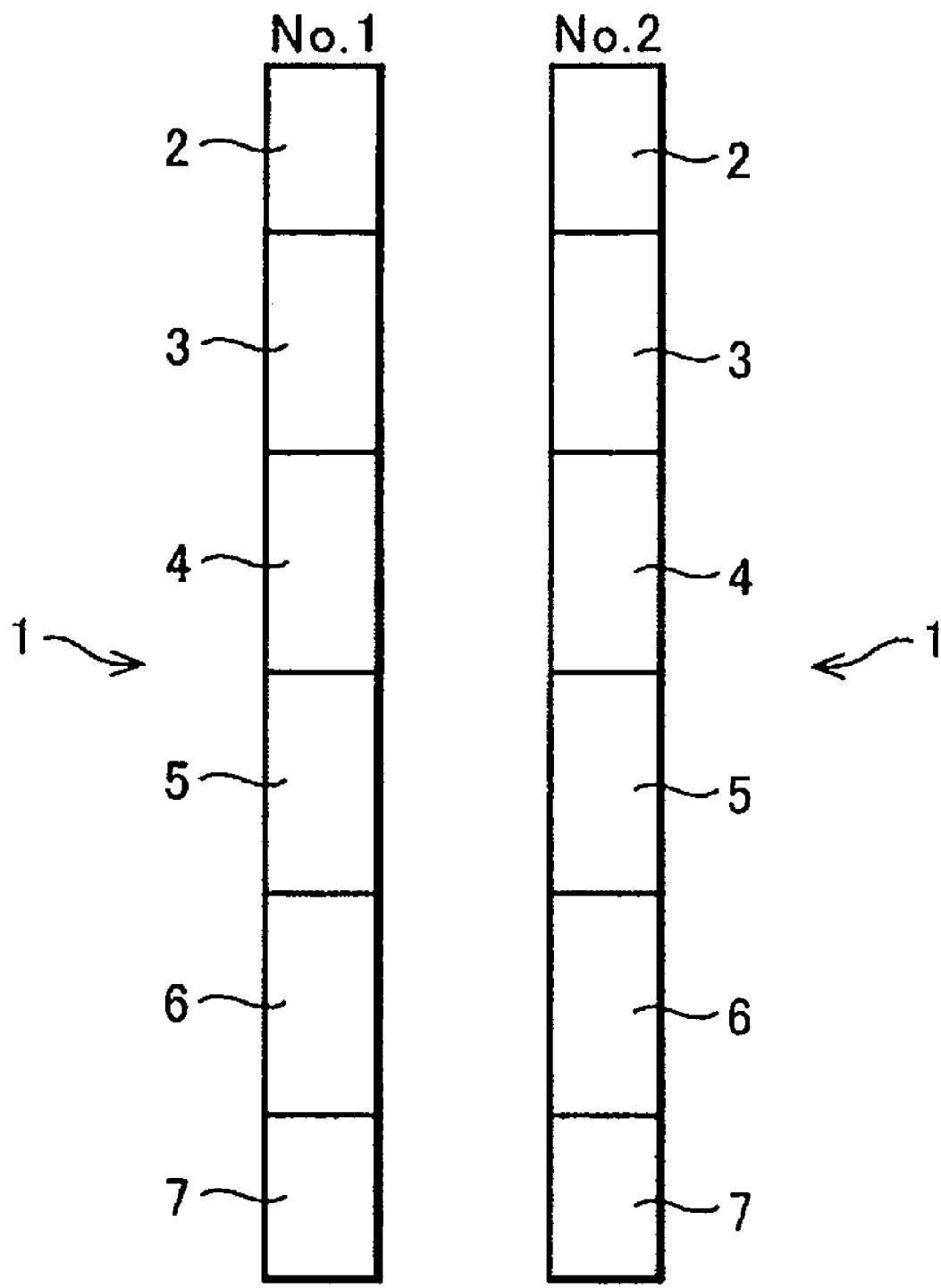
FIG. 1 shows a schematic diagram of an electronic component mounting line of an embodiment of this invention.

First, a numeral "1" shown in FIG. 1 designates an electronic component mounting line for mounting an electronic component on a printed board 9. This mounting line 1 has a loader 2 provided first therein, a screen printer 3 for coating cream solder on the printed board 9 sequentially supplied from the loader 2, a dispenser 4 for coating a desiccant for temporarily setting an electronic component 8 on the printed board 9 supplied from the printer 3, an electronic component mounting apparatus 5 for mounting the electronic component 8 in a predetermined position coated with the cream solder on the printed board 9 supplied form the dispenser 4, a reflow furnace 6 for soldering the electronic component 8 by heating the cream solder on the printed board 9 supplied from the electronic component mounting apparatus 5, and an unloader 7 for sequentially storing the printed board 9 supplied from the reflow furnace 6.

Figure 2:
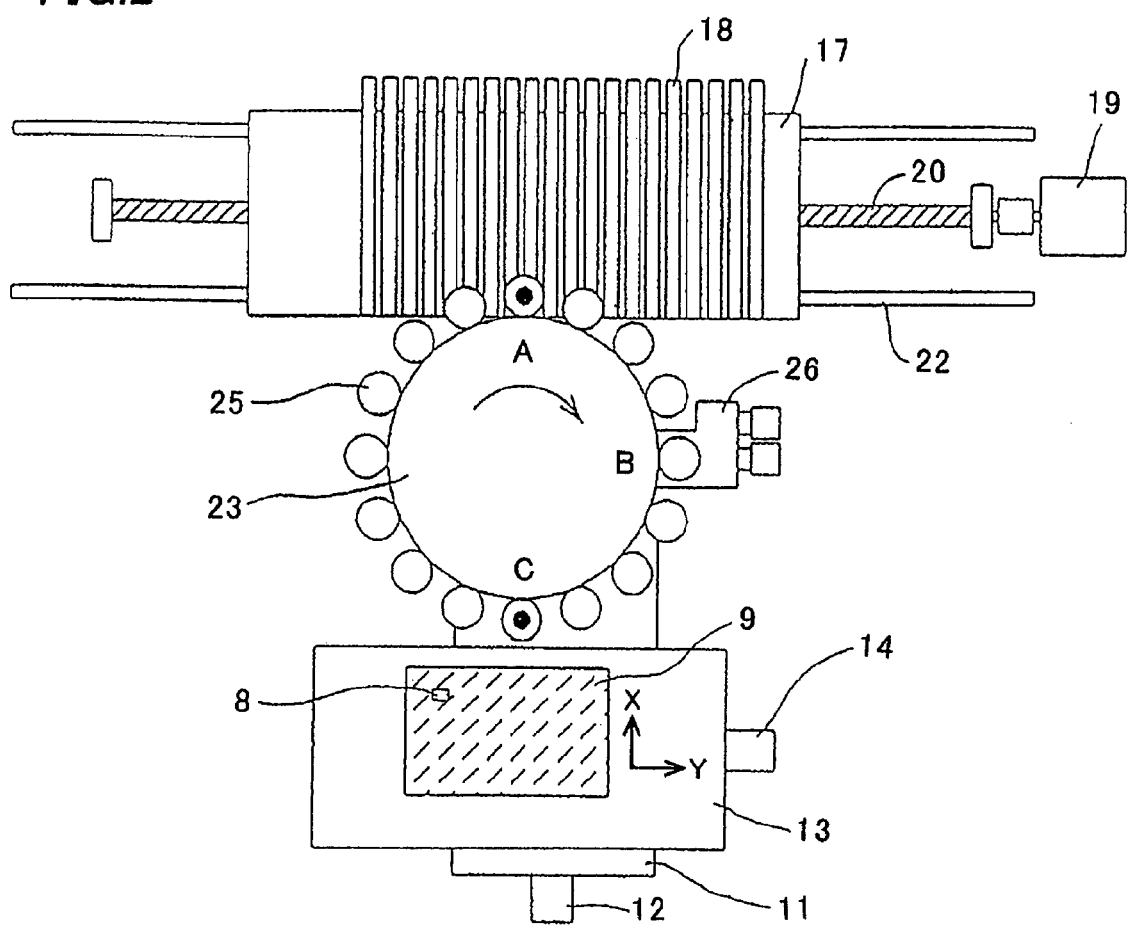
FIG. 2 is a plan view of an electronic component mounting apparatus used in the line shown in FIG. 1.

Description will be made hereafter in a case where two of the above electronic component mounting lines 1 are set in a factory as an example. Although one electronic component mounting apparatus 5 is described in this embodiment for convenience, the invention is not limited to this, and a plurality of the electronic component mounting apparatuses 5 can be provided. The electronic component mounting apparatus 5 will be described with reference to FIG. 2 hereafter. A numeral 11 designates a Y table moving in a Y direction driven by a Y axis motor 12, and a numeral 13 designates a XY table moving in X and Y directions by moving in the X direction on the Y table 11 driven by a X axis motor 14, where the printed board 9 to be mounted with the chip-type electronic component 8 is fixed by a fixing device (not shown).

A numeral 17 designates a component feeding stage which is provided with many component feeding units 18 serving as component feeding devices for feeding the electronic components 8. A numeral 19 designates a feeding stage drive motor which rotates a ball screw 20 to move the feeding stage 17 in the X direction along a linear guide 22 through a nut 21 engaged with the ball screw 20 and fixed to the feeding stage 17. A numeral 23 designates a rotary table intermittently rotating itself. On an outer circumference of the table 23, mounting heads 25 having a plurality of suction nozzles 24 serving as pickup nozzles are provided at predetermined intervals corresponding to intermittent pitches.

A pickup station A lies in a position where the mounting head 25 having the suction nozzle 24 for picking the component 8 up by suction from the feeding unit 18 stops when the rotary table 23 stops during intermittent rotation. At the pickup station A, the mounting head 25 descends and the suction nozzle 24 picks the component 8 up by suction.

B designates a recognition station where the mounting head 25 holding the component 8 by suction stops during the intermittent rotation of the rotary table 23 and a component recognition camera 26 takes an image of the component 8 to recognize a positional shift of the component 8 from a normal position on the suction nozzle 24.

C designates a mounting station where the mounting head 25 stops so that the suction nozzle 24 mounts the holding component 8 on the printed board 9. At this mounting station C, the mounting head 25 descends, and the component 8 is mounted on the printed board 9 stopping at a predetermined position by moving of the XY table 13.

The mounting head 25 is attached to a linear guide 32 through a head block 31, being movable upward and downward above the rotary table 13.

Figure 3:
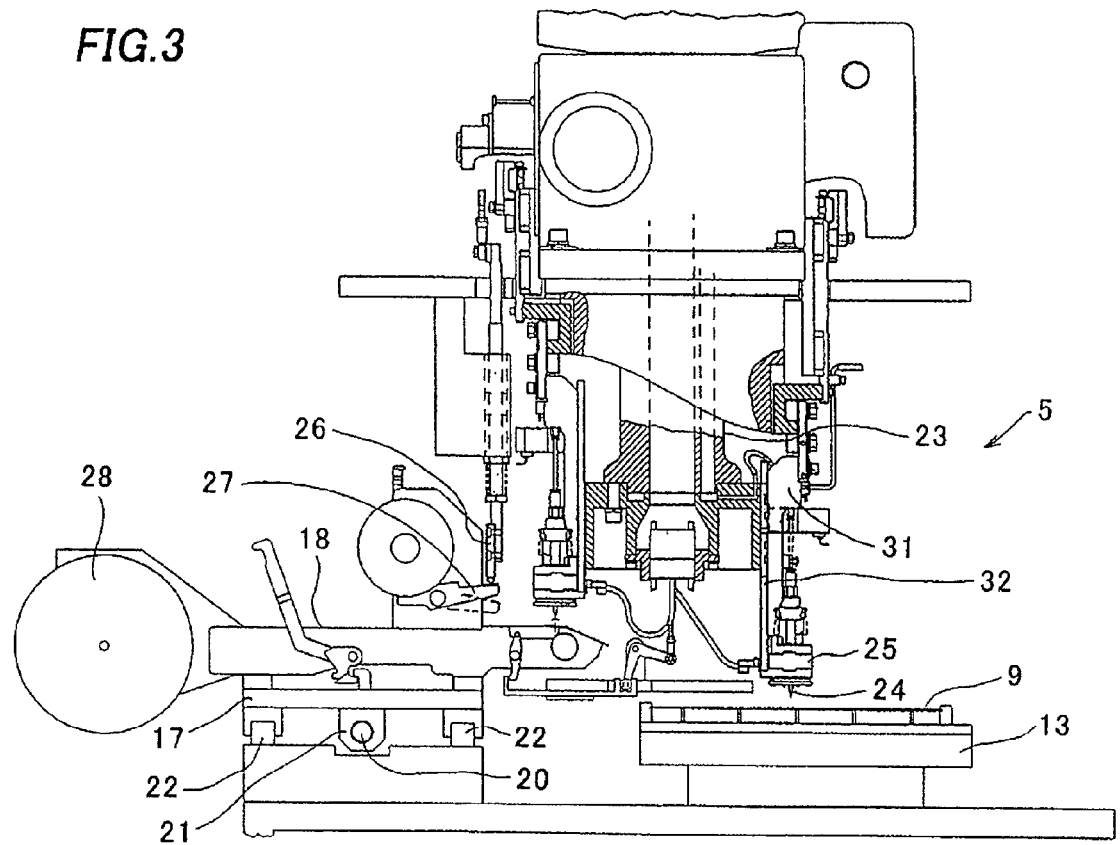
FIG. 3 is a partial cross-sectional side view of the electronic component mounting apparatus of FIG. 2.

In FIG. 3, a numeral 26 designates a shift lever moving upward and downward so as to rotate a rotation lever 27 of the component feeding unit 18. The shift lever 26 rotates the lever 27 to feed a storage tape as a storage member (not shown) wound around the tape feeding reel 28 to feed the electronic component 8 stored in the storage tape to a pickup position for the nozzle 24.

Figure 4:
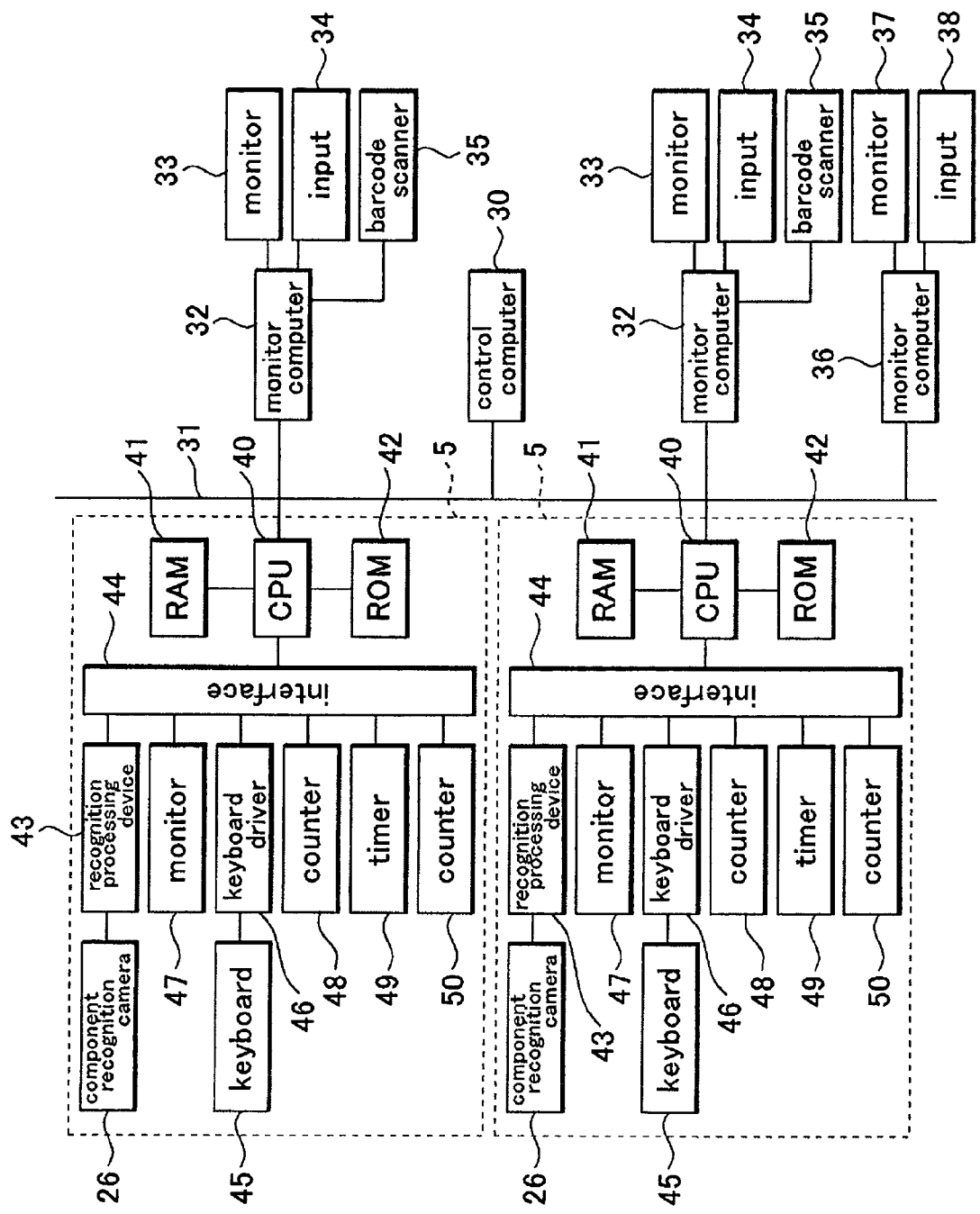
FIG. 4 is a system block diagram of the electronic component mounting line of FIG. 1.

A numeral 30 shown in FIG. 4 designates a control computer having a microcomputer and so on, which is connected with the electronic component mounting apparatuses 5 each provided in each of the two electronic component mounting lines 1 through a network connection 31, such as Ethernet®. This control computer 30 is connected with the monitor computers 32 each provided near each of the electronic component mounting lines 1 through the same network connection 31. Each of these monitor computers 32 has a monitor 33 and an input device 34, and is connected with a barcode scanner 35.

Furthermore, the control computer 30 is connected with a monitor computer 36 provided in a stockroom through the network connection 31. This monitor computer 36 has a monitor 37 and an input device 38.

Each of the electronic component mounting apparatuses 5 has a CPU 40 serving as a control portion controlling the apparatus 5, and a RAM (random access memory) 41 and a ROM (read only memory) 42 both connected with the CPU 40 through a bus. The CPU 40 controls a component mounting operation of the electronic component mounting apparatus 5 based on data stored in the RAM 41 and according to a program stored in the ROM 42.

The RAM 41 is stored with mounting data on component mounting, including information about X and Y directions (indicated by X and Y) on the printed board 9 and an angle of the component 8 in mounting order (in order of step number), and alignment numbers of the component feeding units 18. Furthermore, the RAM 41 is stored with information on types of the electronic components (component ID) corresponding to the alignment numbers (lane numbers) of the component feeding units 18, that is, the component alignment information, and component library data on the number of the stored electronic components for each of the component IDs.

A numeral 43 designates a recognition processing device connected with the CPU 40 through an interface 44. The recognition processing device 43 performs recognition processing to images taken and stored by the component recognition camera 26, and sends a recognition result to the CPU 40. That is, the CPU 40 outputs a command to perform recognition processing (e.g. calculation of a shifting amount of an electronic component from a normal position) to images taken and stored by the component recognition camera 26 to the recognition processing device 43, and receives a recognition processing result from the recognition processing device 43.

A numeral 45 is a keyboard serving as an input device for setting data, being connected with the CPU 40 through a keyboard driver 46 and the interface 44. A numeral 47 designates a monitor for displaying a screen for setting component images or various data. A touch panel can be used as the input device instead of the keyboard 45.

For giving a notice of component shortage, the number of remaining electronic components for each of types thereof, the number of manufacturable boards remaining, and remaining time for manufacturing calculated from total time for manufacturing at each of the component feeding units 18 calculated from the number of electronic components stored therein and time for manufacturing one printed board (mounting time) are stored in the RAM 41 in advance with the monitor 47 and the keyboard 45.

A numeral 48 is a subtraction counter connected with the CPU 40, which subtracts "1" from the number of stored components in each of mounting operations of the electronic components stored in each of the storage tapes. Although this subtraction counter 48 is provided for each of the component feeding units 18 set with the storage tapes storing the electronic components, only one subtraction counter 48 is shown in FIG. 4 for convenience. A numeral 49 is a timer connected with the CPU 40, which keeps time of manufacturing operations of the electronic component mounting apparatus 5. A numeral 50 is a subtraction counter connected with the CPU 40, which subtracts "1" from the total number of manufacturable boards in each of the manufacturing operations of the printed boards 9.

As each of the electronic components 8 is mounted in each of the sequential operations of the electronic component mounting apparatus 5, the number of the remaining electronic components 8 stored in the predetermined storage tape, the number of manufacturable printed boards remaining are reduced by the counters 48 and 50 counting numbers, and the remaining time for manufacturing is reduced by the timer 49 keeping time. When one of the counters 48 and 50 and the timer 49 reaches the set number of remaining components, the set number of manufacturable printed boards remaining, or the set remaining time for manufacturing, the CPU sends notice information about shortage of the electronic components in the component feeding unit 18 to the control computer 30. It is noted that the invention is not limited to such a case that the CPU 40 sends the notice information about component shortage when one of the counters 48 and 50 and the timer 49 reaches the set number of remaining components, the set number of manufacturable boards remaining, or the set time for manufacturing. Instead, the CPU 40 can send the notice information about component shortage when reaching selected one of these.

Under the structure described above, when an automatic operation starts, the printed board 9 is supplied from the dispenser 4, fixed on the XY table 13 by the fixing device, and moves to the mounting position. When the mounting head 25 stops at the pickup station A during intermittent rotation of the rotary table 23 through an index system, the feeding stage drive motor 19 is driven to move the feeding stage 17, and the component feeding units 18 storing the electronic components 8 to be supplied according to the mounting data stored in the RAM 41 moves to and stops at the pickup position for the suction nozzle 24 of the mounting head 25 at the pickup station A. Then, the suction nozzle 24 descends to pick the electronic component 8 up.

Next, while the rotary table 23 intermittently rotates through the index system, the mounting head 25 holding the electronic component 8 moves to and stops at the next station. The rotary table 23 further rotates, and the mounting head 25 moves to and stops at the recognition station B. Then, the component recognition camera 26 takes an image of the electronic component 8 held by the suction nozzle 24 by suction and the recognition processing device 43 recognizes the image taken, so that a positional shift of the component 8 from a normal position on the suction nozzle 24 can be recognized.

Next, when completing the recognition processing, the CPU 40 of the electronic component mounting apparatus 5 adds an amount to be corrected calculated by using a result of the recognition in the XY coordinates and the mounting angle in the mounting data stored in the RAM 41. The CPU 40 drives a pulse motor (not shown) for rotating the suction nozzle 24 at angles, and drives the Y axis motor 12 and the X axis motor 14 to move the XY table 13 in planar directions, by an amount calculated by adding the amount to be corrected in the positional values in the mounting data.

Then, the mounting head 25 reaches the mounting station C by the rotary table 23 intermittently rotating, and the electronic component 8 positioned at the angle calculated by adding the amount to be corrected in the positional value in the mounting data is mounted on the printed board 9 positioned in the planar directions by the movement of the XY table 13.

Accordingly, as the electronic component 8 is picked up by suction from each of the component feeding units 18 and mounted on the printed board 9 sequentially, and this pickup and mounting operation is repeated on other printed boards 9 sequentially, the number of electronic components in the tape feeding reel 28 of each of the component feeding units 18 gradually reduces.

Figure 5:
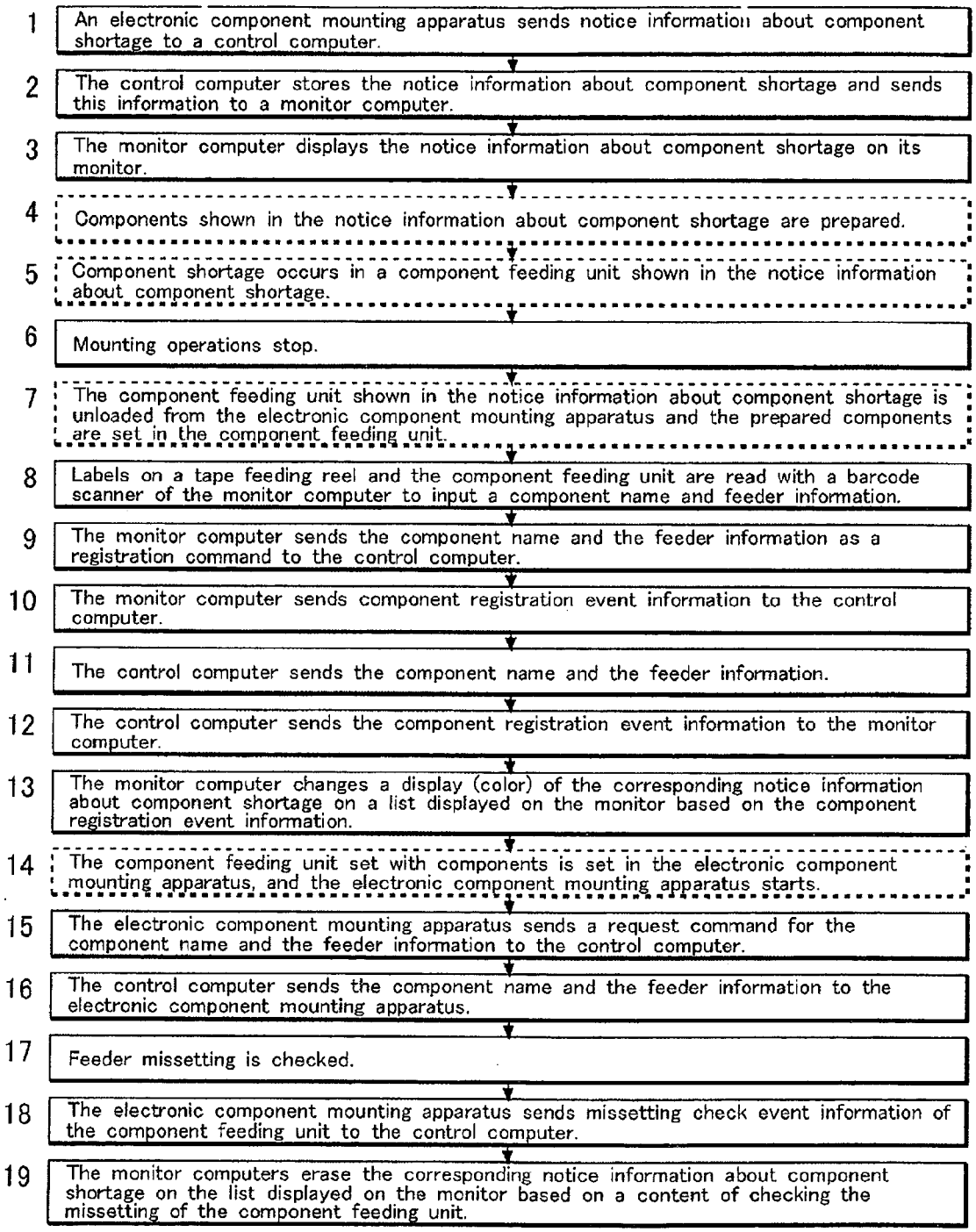
FIG. 5 is a flow chart of an operation of the electronic component mounting line of FIG. 1.

Then, when each of the counters 48 reaches the number of remaining electronic components, which is set for sending the notice of component shortage, while repeating the subtraction of "1" from the number of the electronic components stored in the storage tape set in each of the component feeding units 18 in each of the component mounting operations, when each of the counters 50 reaches the number of manufacturable boards remaining, which is set for sending the notice of component shortage, while repeating the subtraction of "1" from the total number of manufacturable boards calculated from the number of the electronic components stored in the storage tape set in each of the component feeding units 18 in each of printed board manufacturing operations, or when the timer 49 reaches the remaining time for manufacturing, which is set for sending the notice of component shortage, while keeping time of manufacturing operations and repeating the subtraction of accumulation time of the timer 49 from the total time for manufacturing operations calculated from the number of electronic components stored in the storage tape set in each of the component feeding units 18, the CPU 40 of the electronic component mounting apparatus 5 sends the notice information about shortage of the electronic components in the corresponding component feeding unit 18 to the control computer 30 through the network connection 31 (FIG. 5). The above calculation is performed by the CPU 40.

In detail, for example, when the electronic components 8 stored in the storage tape having a device number "MC-1", a lane number (feed unit alignment number) "101", a component ID (component type) "COMP-ID", and a feeder SN (serial number of component feeding unit) "FD08001" reduce, and one of the counters 48 and 50 and the timer 49 reaches the set number of remaining electronic components, the set number of manufacturable boards remaining, or the set remaining time for manufacturing, the CPU 40 of the electronic component mounting apparatus 5 sends the notice information about component shortage to the control computer 30 through the network connection 31 (see FIG. 5 hereafter).

Then, the control computer 30 stores this notice information about component shortage in its inner and outside memories, and sends this notice information about component shortage to the monitor computers 32 and 36 through the network connection 31. The monitor computers 32 and 36 receiving the notice information display the device number "MC-1", the lane number (feeding unit alignment number) "101", the component ID (component type) "COMP-ID", the feeder SN (serial number of component feeding unit) "FD08001" and so on, on the monitors 33 and 37 as shown in FIG. 6.

Therefore, an operator of each of these electronic component mounting lines 1 can recognize that the number of the electronic components is low, by watching the monitors 33 and 37 of the monitor computers 32 and 36 near the electronic component mounting line 1 and in the stockroom. Thus, the operator can prepare the tape feeding reel 28 storing the electronic components 8 having the component ID "COMP-ID" shown in the notice of component shortage from the stockroom before the shortage of the electronic components occurs, so that the tape feeding reel 28 can be set in the component feeding unit 18 having the device number "MC-1", the lane number "101", and the feeder SN "FD08001" immediately when the shortage of the electronic components occurs.

When the shortage of the electronic components occurs, that is, for example, when a photo sensor (not shown) detects a deep end of the storage tape by receiving a reflection light from a reflection board (not shown) provided near an end of the storage tape, the CPU 40 of the electronic component mounting apparatus 5 inputted with a detection signal of the deep end stops the electronic component mounting apparatus 5.

Therefore, the operator unloads the component feeding unit 18, where the components are in shortage, from the component feeding stage 17 of the electronic component mounting apparatus 5 of the device number "MC-1", and sets the prepared storage tape storing the electronic components 8 in the component feeding unit 18. Then, the operator uses a barcode scanner 38 of the monitor computer 32 in the corresponding electronic component mounting line 1 to read and store a barcode (component ID) on a label provided on the tape feeding reel 28 winding the storage tape thereon and a barcode (serial number) on a label provided on the component feeding unit 18 in a memory (not shown) of the monitor computer 32, and sends a name of the electronic component (component ID) and feeder information (serial number) to the control computer 30 as a registration command. That is, the operator sends relation information showing a relation between the component feeding unit and the electronic components, that is, which component feeding unit is set with the storage tape and which electronic components are stored in the storage tape set in the component feeding unit, to the control computer 30. At this time, the input device 34 or other input device can be used to input the component ID and the serial number, instead of the barcode scanner 38. Furthermore, the monitor computer 32 sends component registration event information including work information about completion of registration of the relation information (work information, the serial number of the component feeding unit, the component ID representing the type of the electronic component, the number of the stored electronic components corresponding to the component ID in the component library data, and so on) to the control computer 30. Then, the control computer 30 stores the name of the electronic component, the feeder information, and the component registration event information in its inner and outer memories, and simultaneously, the control computer 30 sends the component registration event information to the monitor computers 32 and 36 which are set in advance as sending targets.

When receiving the component registration event information, the monitor computers 32 and 36 display the notice information of component shortage described above in a different state from a state displayed as shown in FIG. 6, for example, display the list in a green color which is different from a color displayed as shown in FIG. 6, on the monitors 33 and 37. Therefore, the operator can recognize that setting of the tape feeding reel 28 winding the storage tape storing the same type of electronic components as the components in shortage in the component feeding unit 18 where the components are in shortage is completed without fail.

Then, the component feeding unit 18 of the feeder SN "FD08001" set with the new tape feeding reel 28 is set in the position of the lane number "101" in the electronic component mounting apparatus 5 of the device number "MC-1" provided in the electronic component mounting line 1, and the operation is started by operating an operation start switch (not shown). The CPU 40 of the electronic component mounting apparatus 5 of the device number "MC-1" sends a request command for the name of the electronic components and the feeder information to the control computer 30.

Then, the control computer 30 receiving the request command sends the name of the electronic components and the feeder information to the CPU 40 of the electronic component mounting apparatus 5. The CPU 40 of the electronic component mounting apparatus 5 controls and performs checking of an error in the setting position of the component feeding unit 18 on the feeding stage 17, that is, feeder missetting.

That is, the CPU 40 drives the feeding stage drive motor 19 to move the feeding stage 17, and a sensor (not shown) provided outside the feeding stage 17 reads a barcode (the serial number of the component feeding unit) on a label provided in the component feeding unit 18 provided on the feeding stage 17.

The CPU 40 matches this read-out serial number of the component feeding unit 18 with the feeder information (the serial number) and the name of the electronic components received from the control computer 30, recognizes the name of the electronic component in the set component feeding unit, and compares this recognized name with the name of the electronic component corresponding to the lane in the component alignment information stored in the RAM 41 of the electronic component mounting apparatus 5, thereby completing the checking of the feeder missetting.

The CPU 40 of the electronic component mounting apparatus 5 of the device number "MC-1" receiving the name of the electronic component and the feeder information (the serial number) from the control computer 30 sends the feeder missetting check event information, that is, the content of checking of the feeder missetting to the monitor computers 32 and 36 through the control computer 30.

Then, the monitor computers 32 and 36 erase the notice information of component shortage displayed in a green color on the monitors 33 and 37 when no setting mistake is found in the feeder missetting check event information.

Accordingly, the operator can be prevented from mistakenly setting the component feeding unit set with other storage tape than the storage tape storing the same type of electronic components as the components in shortage in the electronic component mounting apparatus when the shortage of the components occurs.

Although particular preferred embodiment of the invention has been disclosed in detail, it will be recognized that variations or modifications of the invention are possible based on the disclosure and lie within the scope of the invention.

What is claimed is:

1. An electronic component mounting system comprising:
   an electronic component mounting apparatus comprising a plurality of component feeding units feeding electronic components from a storage member, a memory provided for each of the component feeding units and keeping track of the number of electronic components remaining in the storage member to generate a notice of shortage of electronic components, the number decreasing as the electronic components are mounted on printed boards, and a CPU outputting the notice when the number of the electronic components remaining in the storage member reaches a predetermined number;
   a monitor computer comprising a display device displaying the notice and an input device inputting replenishment data correlating electronic components supplied in response to the notice and at least one of the component feeding units receiving the supplied electronic components, the monitor computer changing a display status of the notice displayed on the display device based on a confirmation of a completion of a registration of component registration event data comprising the replenishment data; and
   a control computer receiving and storing the notice outputted from the CPU and sending the notice to the monitor computer,
   wherein the monitor computer sends the replenishment data and the component registration event data to the control computer, and the control computer stores the replenishment data and the component registration event data and sends the component registration event data to the monitor computer.

2. The electronic component mounting system of claim 1 wherein the control computer sends the replenishment data to the electronic component mounting apparatus based on a request for the replenishment data from the electronic component mounting apparatus, and the electronic component mounting apparatus sends to the monitor computer a result of checking a miss-setting of the component feeding unit based on the replenishment data, and the monitor computer erases the notice displayed on the display device when the received checking result contains no miss-setting.

3. A method of picking electronic components up from a plurality of component feeding units each comprising a storage member containing the electronic components and mounting the electronic components on a printed board, the method comprising:
   storing in a memory predetermined limits to issue a notice of shortage of the electronic components, the predetermined limits including the minimum number of the electronic components that must be in the storage member for each of the component feeding units;

sending the notice to a control computer when the number of the electronic components remaining in the storage member reaches a corresponding predetermined limit as the electronic components are mounted on the printed board;

storing the notice in the control computer and sending the notice to a monitor computer from the control computer;

displaying the notice sent by the control computer on a display device provided in the monitor computer;

inputting in the monitor computer based on the displayed notice replenishment data correlating electronic components supplied in response to the notice and at least one of the component feeding units receiving the supplied electronic components;

sending the replenishment data and component registration event data including the replenishment data from the monitor computer to the control computer;

storing the replenishment data and the component registration event data in the control computer and sending the component registration event data from the control computer to the monitor computer; and changing a display status of the notice displayed on the display device based on a reception of the component registration event date from the control computer by the monitor computer.

4. The method of claim 3, further comprising sending the replenishment data from the control computer to an electronic component mounting apparatus based on a request for the replenishment data from the electronic component mounting apparatus, sending a result of checking a miss-setting of a corresponding component feeding unit based on the replenishment data from the electronic component mounting apparatus to the monitor computer, and erasing the notice displayed on the display device when the received checking result contains no miss-setting.

* * * * *